United States Patent
Kwon

(10) Patent No.: US 10,003,845 B2
(45) Date of Patent: Jun. 19, 2018

(54) REMOTE CONTROLLER, CONTROL METHOD THEREOF AND IMAGE PROCESSING APPARATUS HAVING THE SAME

(71) Applicant: SAMSUNG ELECTRONICS CO., LTD., Gyeonggi-do (KR)

(72) Inventor: Ki-moon Kwon, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 122 days.

(21) Appl. No.: 15/097,713

(22) Filed: Apr. 13, 2016

(65) Prior Publication Data

US 2016/0227268 A1  Aug. 4, 2016

Related U.S. Application Data

(63) Continuation of application No. 12/237,420, filed on Sep. 25, 2008, now Pat. No. 9,781,467.

(30) Foreign Application Priority Data

Dec. 5, 2007  (KR) .................. 10-2007-0125449

(51) Int. Cl.
*H04L 17/02* (2006.01)
*H04N 21/431* (2011.01)
(Continued)

(52) U.S. Cl.
CPC ......... *H04N 21/4312* (2013.01); *G08C 17/02* (2013.01); *H03J 1/0025* (2013.01);
(Continued)

(58) Field of Classification Search
CPC ....................................................... H04L 17/02
(Continued)

(56) References Cited

U.S. PATENT DOCUMENTS 5,231,578 A  7/1993 Levin et al.
5,545,857 A  8/1996 Lee et al.
(Continued)

FOREIGN PATENT DOCUMENTS

JP           8076978 A    3/1996
KR    1019960006683 A    2/1996
(Continued)

OTHER PUBLICATIONS

Notice of Allowance dated Feb. 28, 2012 in corresponding Korean Application No. 10-2007-0125499.
(Continued)

*Primary Examiner* — Fritz M Fleming
*Assistant Examiner* — Joseph Inge
(74) *Attorney, Agent, or Firm* — Sughrue Mion, PLLC

(57) ABSTRACT

A remote controller of an image processing apparatus includes: a touch screen which displays an input menu; a menu processor which processes the touch screen to display respective input menus corresponding to at least two modes among a control mode of the image processing apparatus, a character input mode and a handwriting mode; and a controller which controls the menu processor to display the input menu of the mode corresponding to a selection signal when the selection signal for the mode is received.

18 Claims, 5 Drawing Sheets

(51) Int. Cl.
*G08C 17/02* (2006.01)
*H03J 1/00* (2006.01)
*H04N 21/422* (2011.01)
*H04N 21/482* (2011.01)

(52) U.S. Cl.
CPC ..... *H04N 21/42224* (2013.01); *H04N 21/482* (2013.01); *G08C 2201/30* (2013.01); *H03J 2200/26* (2013.01)

(58) Field of Classification Search
USPC .......................................................... 341/176
See application file for complete search history.

(56) References Cited

U.S. PATENT DOCUMENTS

| | | | |
|---|---|---|---|
| 5,654,529 | A | 8/1997 | Yeung et al. |
| 6,208,341 | B1 | 3/2001 | van Ee et al. |
| 6,717,073 | B2 | 4/2004 | Xu et al. |
| 7,094,977 | B2 | 8/2006 | Ericson et al. |
| 7,230,563 | B2 | 6/2007 | Vidal |
| 7,669,770 | B2 | 3/2010 | Wheeler et al. |
| 8,225,364 | B2 | 7/2012 | Jeon |
| 2003/0071855 | A1 | 4/2003 | Kim |
| 2003/0169234 | A1 | 9/2003 | Kempisty |
| 2004/0075602 | A1 | 4/2004 | Griesau et al. |
| 2005/0108751 | A1 | 5/2005 | Dacosta |
| 2005/0264538 | A1* | 12/2005 | Yeh .................. G06F 3/03547 345/173 |
| 2006/0028582 | A1 | 2/2006 | Zahn |
| 2006/0192753 | A1 | 8/2006 | Fukuhara |
| 2007/0236613 | A1* | 10/2007 | Foss .................. H04N 5/4403 348/734 |
| 2008/0088487 | A1 | 4/2008 | Li |
| 2009/0146860 | A1 | 6/2009 | Kwon |
| 2011/0279375 | A1 | 11/2011 | Hatambeiki et al. |

FOREIGN PATENT DOCUMENTS

| | | |
|---|---|---|
| KR | 1019970058192 A | 7/1997 |
| KR | 1020040047302 A | 6/2004 |
| KR | 1020070035102 A | 3/2007 |
| KR | 1020070087318 A | 8/2007 |

OTHER PUBLICATIONS

Non-Final Office Action dated Dec. 3, 2015.
Final Office Action dated Jun. 19, 2015.
Non-Final Office Action dated Jan. 30, 2015.
Final Office Action dated Nov. 7, 2014.
Non-Final Office Action dated Jun. 4, 2014.
Final Office Action dated Dec. 18, 2013.
Non-Final Office Action dated Aug. 30, 2013.
Final Office Action dated Jan. 19, 2012.
Non-Final Office Action dated Sep. 13, 2011.
Communication from United States Patent and Trademark Office dated Jul. 6, 2016, in U.S. Appl. No. 12/237,420.
Communication dated May 8, 2017, issued by the United States Patent and Trademark Office in counterpart U.S. Appl. No. 12/237,420.

* cited by examiner

REMOTE CONTROLLER, CONTROL METHOD THEREOF AND IMAGE PROCESSING APPARATUS HAVING THE SAME

CROSS-REFERENCE TO RELATED APPLICATION

This application is a continuation of application Ser. No. 12/237,420, filed Sep. 25, 2008, which is based upon and claims priority from Korean Patent Application No. 10-2007-0125499, filed on Dec. 5, 2007 in the Korean Intellectual Property Office, the disclosure of which is incorporated herein by reference.

BACKGROUND OF INVENTION

Field of Invention

Apparatuses and methods consistent with the present invention relate to a remote controller for controlling an image processing apparatus, a control method thereof, and the image processing apparatus having the same, and more particularly, to a remote controller for various input modes, a control method thereof, and the image processing apparatus having the same.

Description of the Related Art

An image processing apparatus receives a video signal from a broadcasting station or a video signal from an external device such as a digital versatile disc (DVD) player or the like, and processes the video signal to be displayed as an image. The image processing apparatus is provided with a remote controller for selecting various options such as power on/off, image switching between plural images, image adjustment, volume control, recording reservation, etc.

Further, an image processing apparatus has recently been developed to access a network and perform bidirectional communication with the network. Accordingly, a user may input information to the image processing apparatus. Here, the information input by a user may be so varied and complicated that it cannot be input through the remote controller. To input this information, a separate input unit may be provided in the image processing apparatus.

Such a related art image processing apparatus not only processes a video signal and displays an image based on the video signal but also may perform other various functions. Thus, the image processing apparatus may receive information corresponding to the various functions. However, the related art image processing apparatus needs separate input units in order to receive the information corresponding to the various functions. In this case, the input units occupy a relatively large installation space and are expensive.

Also, it is inconvenient for a user to manipulate diverse input units according to functions.

SUMMARY OF THE INVENTION

Illustrative, non-limiting embodiments of the present invention overcome the above disadvantages and other disadvantages not described above. Also, the present invention is not required to overcome the disadvantages described above, and an illustrative, non-limiting embodiment of the present invention may not overcome any of the problems described above Accordingly, it is an aspect of the present invention to provide a remote controller capable of supporting input menus corresponding to a plurality of input modes, a control method thereof, and an image processing apparatus having the same.

Another aspect of the present invention is to provide a remote controller with a simple structure for switching and displaying a plurality of input menus, a control method thereof, and an image processing apparatus having the same.

The foregoing and/or other aspects of the present invention can be achieved by providing a remote controller of an image processing apparatus, comprising: a touch screen which displays an input menu; a menu processor which processes the touch screen to display respective input menus corresponding to at least two modes among a control mode of the image processing apparatus, a character input mode and a handwriting mode; and a controller which controls the menu processor to display the input menu of the mode corresponding to a selection signal when the selection signal for the mode is received.

The menu processor may process a memo area for handwriting to be displayed on the touch screen.

The menu processor may process a character input menu for inputting at least one of alphabet characters, numerals and special characters to be displayed.

The menu processor may process a plurality of input menus corresponding to the plural modes to be displayed on the touch screen.

The remote controller may further comprise a mode selector to select at least one of the plural modes.

The remote controller may further comprise a controller communication unit which transmits information input through the touch screen to the image processing apparatus, receives the selection signal transmitted to the image processing apparatus through a network, and transmits the selection signal to the controller.

The foregoing and/or other aspects of the present invention can be achieved by providing an image processing apparatus comprising: a remote controller which receives and transmits input information; and an image processing main body which comprises an image processor to receive and process a video signal, and a main body controller to control the image processor on the basis of the information transmitted from the remote controller, the remote controller comprising: a touch screen which displays an input menu; a menu processor which processes the touch screen to display respective input menus corresponding to at least two modes among a control mode of the image processing apparatus, a character input mode and a handwriting mode; and a controller which controls the menu processor to display the input menu of the mode corresponding to a selection signal when the selection signal for the mode is received.

The foregoing and/or other aspects of the present invention can be achieved by providing a method of controlling a remote controller of an image processing apparatus, the method comprising: selecting at least one of plural modes comprising at least two modes among a control mode of the image processing apparatus, a character input mode and a handwriting mode; and displaying an input menu corresponding to the selected mode on a touch screen.

The displaying the input menu may comprise displaying a memo area for handwriting on the touch screen.

The displaying the input menu may comprise displaying a character input menu for inputting at least one of alphabet characters, numerals and special characters.

The displaying the input menu may comprise displaying the plural input menus corresponding to the plural modes on the touch screen.

The selecting the mode may comprise: receiving a selection signal for the mode, which is transmitted through the network, from the image processing apparatus; and selecting the mode on the basis of the received selection signal.

BRIEF DESCRIPTION OF THE DRAWINGS

The above and/or other aspects of the present invention will become apparent and more readily appreciated from the following description of the exemplary embodiments, taken in conjunction with the accompanying drawings, in which.

DETAILED DESCRIPTION OF EXEMPLARY EMBODIMENTS OF THE INVENTION

Figure 1:
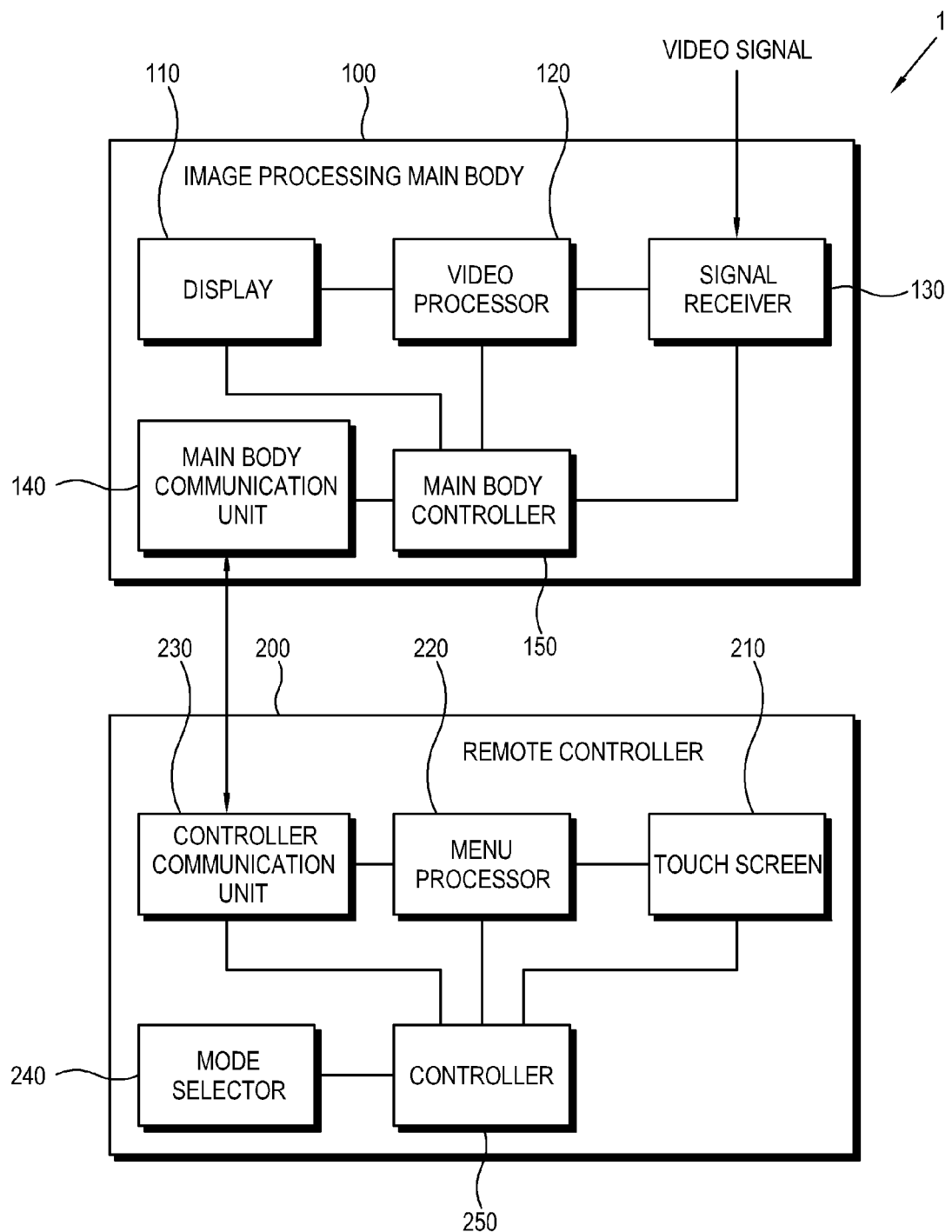
FIG. 1 is a block diagram showing schematic configurations of an image processing apparatus and a remote controller according to a first exemplary embodiment of the present invention.

Reference will now be made in detail to exemplary embodiments of the present invention, examples of which are illustrated in the accompanying drawings, wherein like reference numerals refer to like elements throughout. The embodiments are described below so as to explain the present invention by referring to the figures.

FIG. 1 is a block diagram showing schematic configurations of an image processing apparatus and a remote controller according to a first exemplary embodiment of the present invention.

As shown in FIG. 1, an image processing apparatus 1 according to the first exemplary embodiment includes an image processing main body 100 which receives and processes a video signal to be displayable, and a remote controller 200 which controls operations of the image processing main body 100.

The image processing main body 100 includes a display 110 to display an image thereon; a video processor 120 to process the video signal to display the image; a signal receiver 130 to receive the video signal from a predetermined image source; a main body communication unit 140 through which a signal is transmitted to and received from the remote controller 200; and a main body controller 150 to control operations of the display 110, the video processor 120, the signal receiver 130, and the main body communicator 140. Here, a television, a set-top box, etc. may be employed as the image processing apparatus 1. If the set-top box is used as the image processing apparatus 1, the image processing main body 110 may exclude the display 110.

The remote controller 200 has a plurality of input modes, and the input modes are switchable from one another. According to an exemplary embodiment of the present invention, the plurality of input modes includes a control mode for controlling operation of the image processing main body 100, a character input mode for inputting characters, and a handwriting mode for allowing a user to write. However, the plurality of input modes are not limited to the control mode, the character input mode and the handwriting mode, but may include only two of them or other input modes for additional functions.

The remote controller 200 includes a touch screen 210 to display input menus; a menu processor 220 to process the input menus corresponding to various input modes to be displayed on the touch screen 210; a controller communication unit 230 through which a signal about information input through the touch screen 210, or the like is transmitted to and received from the main body communication unit 140; a mode selector 240 to allow a user to select each input mode; and a controller 250 to control operations of the foregoing elements and control the menu processor 220 to switch the input menu displayed on the touch screen 210 according to which input mode is selected.

The above-described elements will be described in more detail. First, the elements of the image processing main body 100 are as follows.

The display 110 displays an image based on the video signal processed by the video processor 120. The display 110 may be accomplished by a liquid crystal display (LCD) or a plasma display panel (PDP), but is not limited thereto.

The signal receiver 130 receives a video signal from an external image source (not shown) under control of the main body controller 150. The external image source may include a digital versatile disc (DVD) apparatus, a video cassette recorder (VCR), a personal computer (PC), etc. The video signal received in the signal receiver 130 may have formats of Radio Corporation of America (RCA), a high definition multimedia interface (HDMI), a digital video interface (DVI), etc. Alternatively, the signal receiver 130 may receive a video signal from analog television broadcasting, digital television broadcasting, satellite broadcasting, cable broadcasting, etc., from a broadcasting station (not shown), or receive a video signal from a video-on-demand (VOD) server.

The video processor 120 processes the video signal received by the signal receiver 130 to be displayed as an image on the display 110. The video processor 120 may perform decoding corresponding to the format of the video signal, video-processing for improving picture quality, scaling for adjusting the size of an image, image adjustment requested by a user, etc.

The main body communication unit 140 receives a signal from the controller communication unit 230 of the remote controller 200, and transmits the received signal to the main body controller 150. Here, information contained in the signal, an interface for the signal, etc., may be different according to the input modes of the remote controller 200. Then, the main body communication unit 140 receives the signal corresponding to each input mode and transmits it to the main body controller 150.

The main body controller 150 controls the operation of the image processing main body 100 on the basis of a control signal received from the remote controller 200 in the control mode. Further, when the main body communication unit 140 receives a signal containing character information or handwriting image information from the remote controller 200 in the character input mode or the handwriting mode, the main body controller 150 processes or transmits the signal as necessary. For example, when the information input to the remote controller 200 has to be transmitted to a predetermined server (not shown) through a network, the main body controller 150 processes the signal received in the main body communication unit 140 and transmits it through a signal transmitter (not shown) to the network.

Next, the elements of the remote controller 200 are as follows.

The touch screen 210 is provided outside the remote controller 200 and interfaces a user with the remote controller 200. The touch screen 210 displays the input menu corresponding to each input mode, and a user touches the displayed input menu with a finger, a stylus pen or the like so as to input predetermined information. To this end, the touch screen 210 may have diverse configurations. For example, the touch screen 210 has a surface formed with an infrared lattice, and determines which position of the lattice is touched when a user touches the lattice with the finger or a like object. Then, the touch screen 210 determines what option corresponds to the touched positions of the lattice, and implements operation corresponding to the option.

The menu processor 220 processes the input menu corresponding to a selected input mode to be displayed on the touch screen 210 when switching for at least one of the plural input modes is selected. For example, the menu processor 220 processes the input menus corresponding to the control mode, the character input mode and the handwriting mode, respectively.

Figure 2:
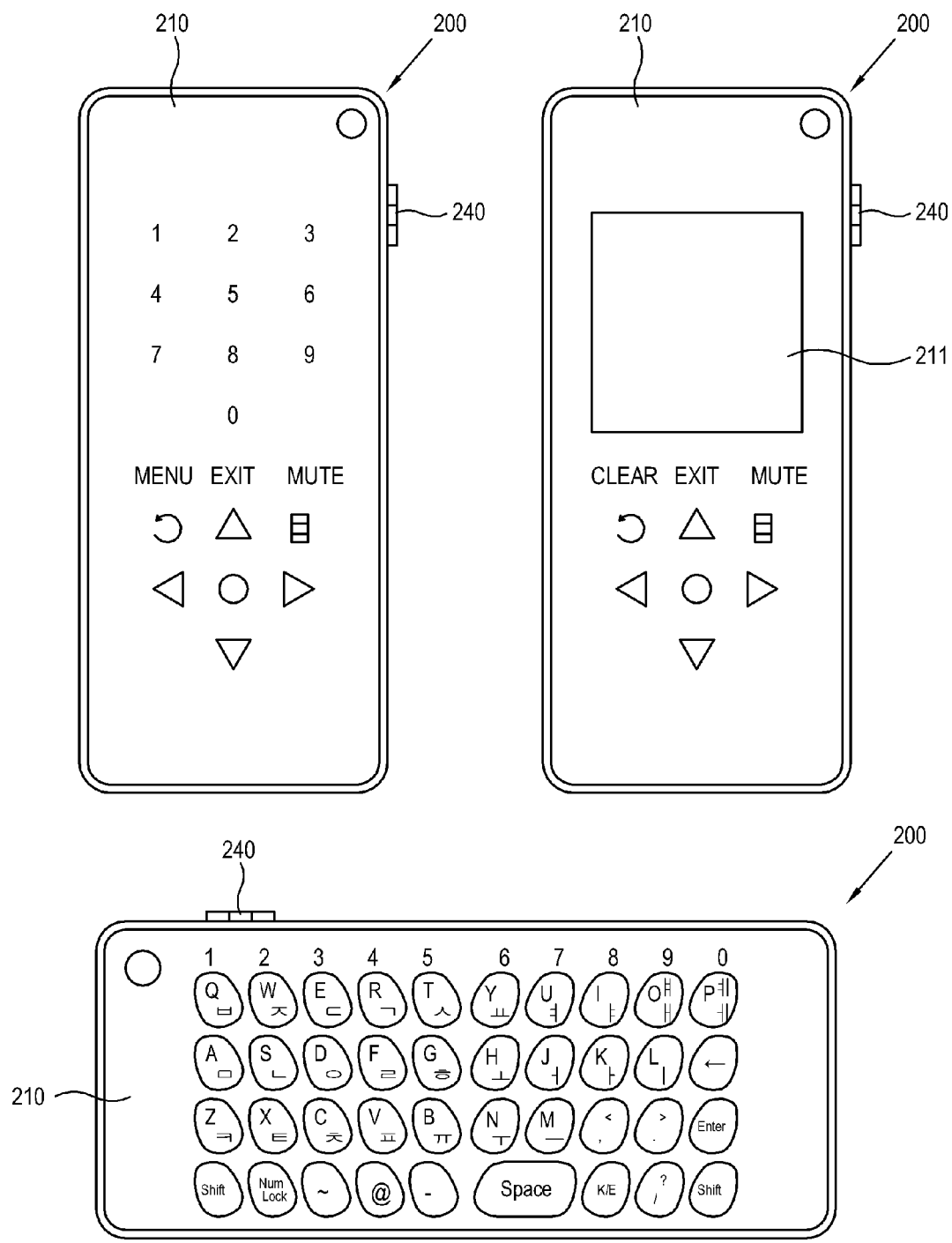
FIG. 2 illustrates an example of an input menu displayed on a touch screen of the remote controller of FIG. 1.

FIG. 2 illustrates that the input menus corresponding to the respective input modes are displayed on the touch screen 210 of the remote controller 200. FIG. 2 just shows an exemplary embodiment and does not limit the scope of the invention. In other words, the menu processor 220 may be designed to display the input menus in various formats.

The remote controller 200, which displays a control menu key corresponding to the control mode, is shown in an upper left part of FIG. 2. The control menu key includes numeral keys for selecting a broadcasting channel; a cursor key for switching image set-up, volume, channels, etc.; a selection key; etc.

The remote controller 200, which displays a character input key corresponding to the character input mode, is shown in a lower part of FIG. 2. The character input key is borrowed from a keyboard layout for a general computer system, but not limited thereto. Thus, the character input key allows a user to input Hangeul (Korean alphabet) characters, other alphabet characters (e.g., such as English), numerals, special characters, etc. For example, a Hangeul input key may have a "Dubeolsik" or "Sebeolsik" keyboard layout, and another alphabet input key may have a "QWERTY," "DVORAK" or "AZERTY" keyboard layout.

The remote controller 200, which displays a memo area 211 corresponding to the handwriting mode, is shown in the upper right part of FIG. 2. The memo area 211 is provided in at least one part of the touch screen 210, and thus a user can input information by touching the memo area 211 with his/her finger, a stylus pen or the like. In this case, an auxiliary key may be additionally provided for performing an auxiliary function such as resetting the memo area 211 or the like.

The controller communication unit 230 transmits information input through the touch screen 210 to the main body communication unit 140. When the information is input through the touch screen 210, the controller 250 sends the information to the controller communication unit 230 and the controller communication unit 230 processes the information and wirelessly transmits it to the main body communication unit 140. The controller communication unit 230 is designed to process and transmit information input corresponding to the input modes, respectively.

The mode selector 240 is provided outside the remote controller 200 and is manipulated by a user. The mode selector 240 allows a user to select one among the plural input modes, and informs the controller 250 of the selected input mode, thereby making the controller 250 perform an operation corresponding to the selected input mode. The mode selector 240 may be achieved in the form of a physical button or a key always displayed on one side of the touch screen 210 regardless of switching the input menus.

The controller 250 controls the operations of the elements of the remote controller 200, and controls the menu processor 220 on the basis of a mode selection signal when receiving the mode selection signal through the mode selector 240. When a user selects the input mode through the mode selector 240, the mode selection signal corresponding to the selected input mode is output from the mode selector 240 to the controller 250. Then, the controller 250 switches the remote controller 200 to have the input mode corresponding to the mode selection signal, and controls the menu processor 220 to display the input menu corresponding to the switched input mode on the touch screen 210.

Further, the controller 250 may include a memory (not shown) to store information input when the remote controller 200 is in the character input mode or the handwriting mode. Thus, the controller 250 may control the touch screen 210 to display the information stored in the memory (not shown).

Figure 3:
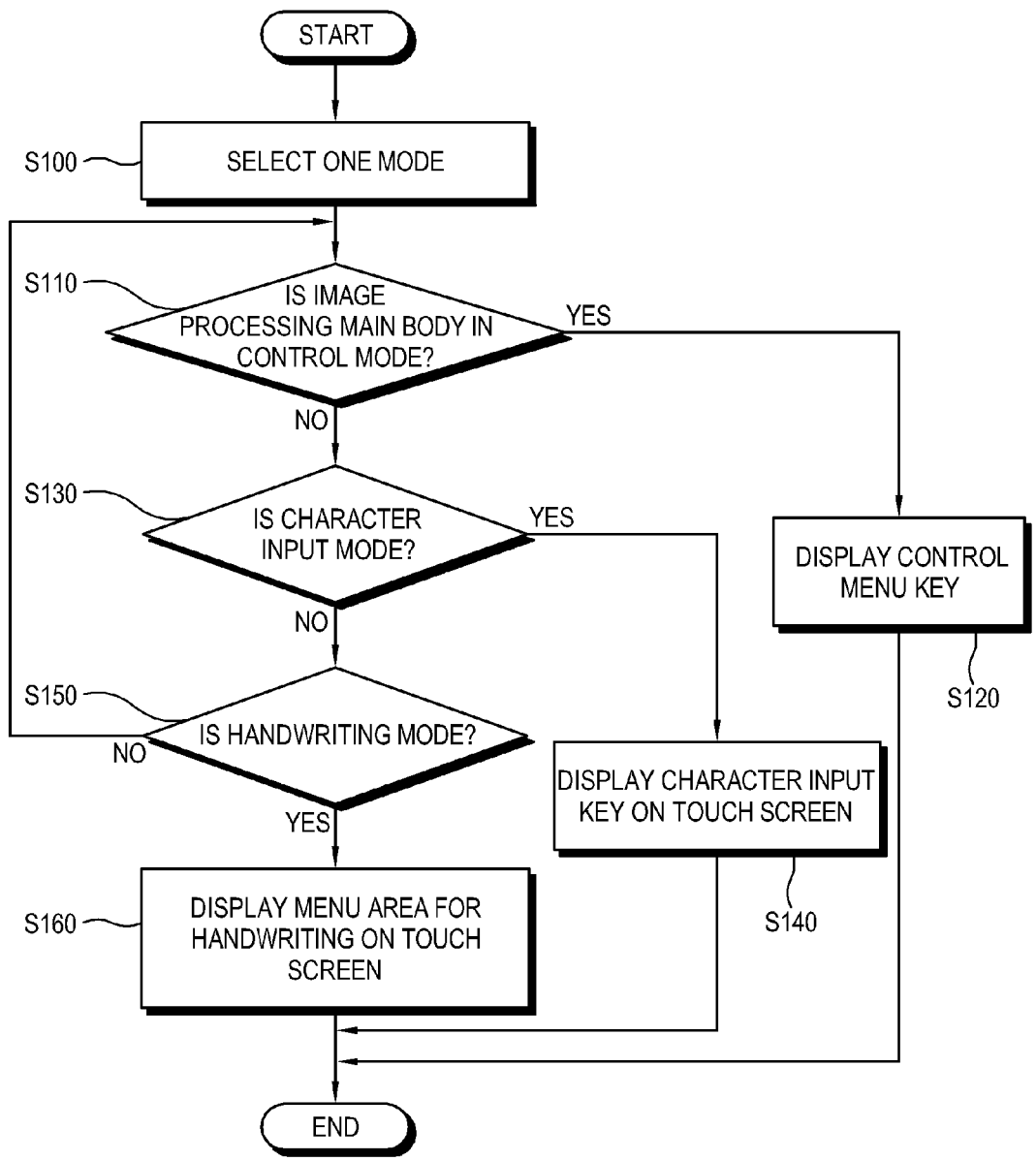
FIG. 3 is a flowchart of displaying an input menu when a mode is selected in the remote controller of FIG. 1.

In the image processing apparatus 1 with this configuration according to the first exemplary embodiment of the present invention, the remote controller 200 displays the input menu corresponding to the selected input mode as follows: which will be described with reference to FIGS. 1 through 3.

At operation S100, a user manipulates the mode selector 240 and selects one among the control mode, the character input mode and the handwriting mode. Correspondingly, the mode selector 240 outputs the mode selection signal to the controller 250, and the controller 250 determines the selected input mode on the basis of the mode selection signal.

If the controller 250 determines the input mode of the image processing main body 100 is selected as the control mode at operation S110, the controller 250 controls the menu processor 220 to display the control menu key corresponding to the control mode on the touch screen 210 at operation S120.

Further, if the controller 250 determines the input mode is selected as the character input mode at operation S130, the controller 250 controls the menu processor 220 to display the character input key on the touch screen 210 at operation S140.

Also, if the controller 250 determines the input mode is selected as the handwriting mode at operation S150, the controller 250 controls the menu processor 220 to display the memo area 211 for handwriting on the touch screen 210 at operation S160.

When the input menu corresponding to each input mode is displayed on the touch screen 210, a user inputs predetermined information by touching the displayed input menu, and the controller 250 processes and stores the input information or transmits a signal corresponding to the input information to the image processing main body 100 through the controller communication unit 230. Then, the main body controller 150 controls the image processing main body 100 on the basis of the received signal corresponding to the input information or transmits the information to the server (not shown) through the network.

Figure 4:
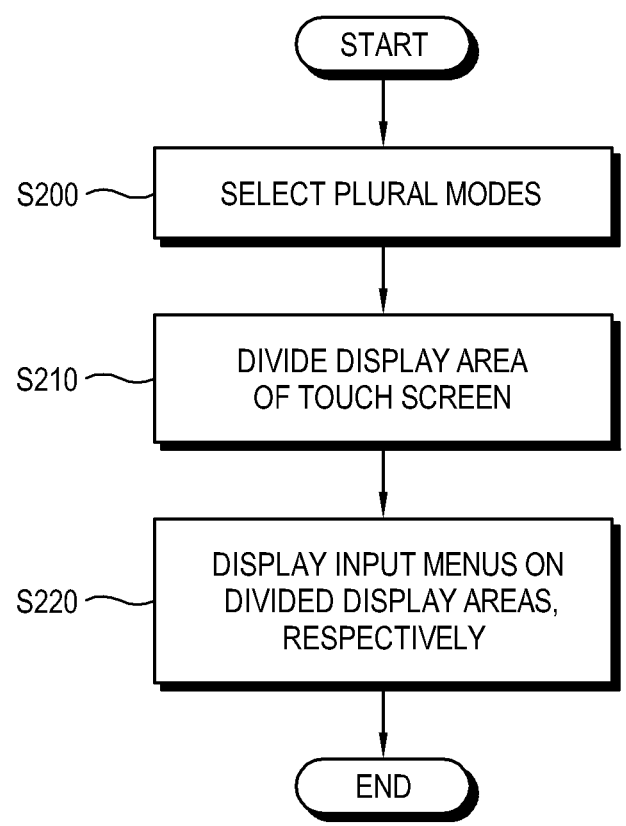
FIG. 4 is a flowchart of displaying input menus when plural input modes are selected in a remote controller according to a second exemplary embodiment of the present invention.

In the first exemplary embodiment, one input mode is selected among the plural input modes, and the input menu corresponding to the selected input mode is displayed on the touch screen 210, but not limited thereto. Alternatively, plural input modes may be selected among the plural input modes, and respective input menus corresponding to the selected input modes may be displayed at once on the touch screen 210. For example, the respective input menus corresponding to two input modes may be displayed at once, which will be described below as a second exemplary embodiment of the present invention with reference to FIGS. 1 and 4. FIG. 4 is a flowchart of displaying input menus in the image processing apparatus 1 when the plural input modes are selected.

As shown in FIGS. 1 and 4, a user selects two among the control mode, the character input mode and the handwriting mode through the mode selector 240 at operation S200. For example, if a user selects the control mode and the handwriting mode, the controller 250 divides a display area of the touch screen 210 into two areas for displaying the input menus corresponding to the selected input modes at operation S210.

The controller 250 displays the control menu key on one display area, and the memo area on the other display area at operation S220. Thus, one touch screen 210 displays both input menus corresponding to two input modes at once, so that a user can input information by manipulating each input menu.

Figure 5:
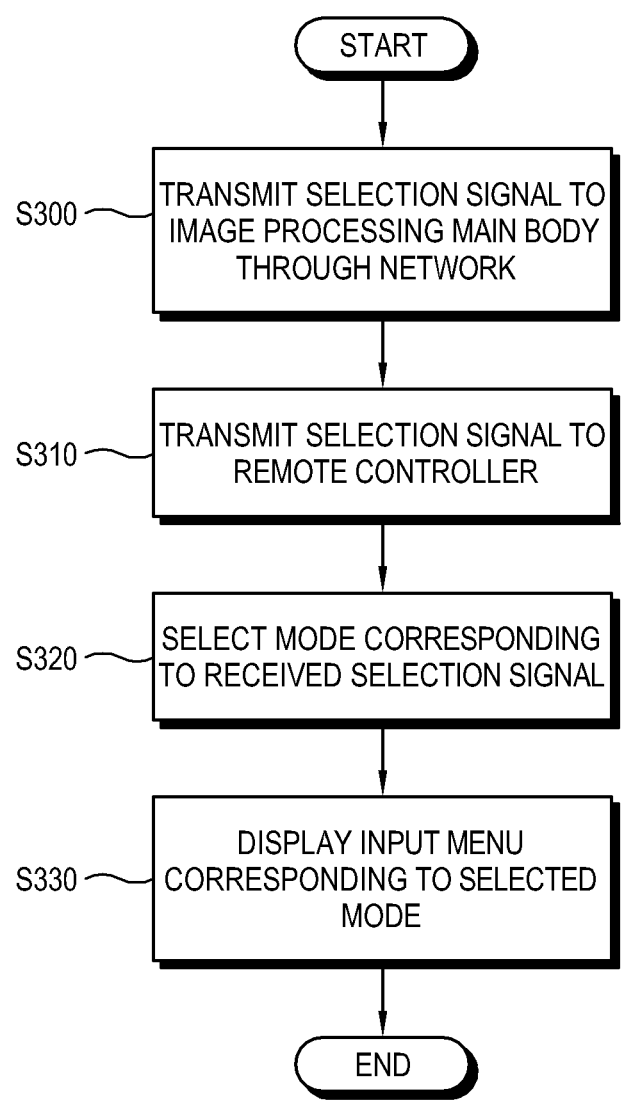
FIG. 5 is a flowchart of displaying an input menu when a remote controller according to a third exemplary embodiment of the present invention receives a mode selection signal from an image processing main body.

Meanwhile, in the first and second exemplary embodiments, the mode selection signal is transmitted to the controller 250 according to how a user manipulates the mode selector 240, but not limited thereto. Alternatively, the mode selection signal may be transmitted through the network connecting with the image processing main body 100, which will be described below as a third exemplary embodiment of the present invention with reference to FIGS. 1 and 5. FIG. 5 is a flowchart of displaying an input menu when the remote controller 200 receives the mode selection signal from the image processing main body 100.

According to the third exemplary embodiment of the present invention, the image processing main body 100 receives the mode selection signal from the network and transmits it to the remote controller 200. To this end, the signal receiver 130 connects with the network and receives the selection signal. Here, the selection signal may be initially generated by a server (not shown) connected with the network, a client terminal (not shown) connected with the server (not shown), etc.

For example, let's suppose that image contents processed by the image processing main body 100 are related to goods in a shopping mall, and a user transmits his/her autographic signature to the shopping mall, which is written for payment when he/she buys the goods in this shopping mall.

The signal receiver 130 connects with the server (not shown) through the network, and the server (not shown) connects with the client terminal (not shown) of the shopping mall through the network.

If a user manipulates the remote controller 200 so as to transmit information about buying the goods to the shopping mall, the client terminal (not shown) of the shopping mall transmits the mode selection signal to the network so that the remote controller 200 can be switched to the handwriting mode, thereby requesting a user's autographic signature.

At operation S300, the mode selection signal is transmitted to the image processing main body 100 through the network. In more detail, the mode selection signal is received by the signal receiver 130. At operation S310, the main body controller 150 transmits the mode selection signal to the remote controller 200 through the main body communication unit 140.

When the controller communication unit 230 receives the mode selection signal, the controller 250 selects the handwriting mode corresponding to the received mode selection signal at operation S320. Then, the input menu corresponding to the selected input mode, i.e., the memo area 211 is displayed on the touch screen 210 at operation S330.

Thus, a user autographically signs on the displayed memo area 211, and allows it to transmit to the image processing main body 100. Then, the image processing main body 100 transmits a user's autographic signature to the shopping mall through the network.

Accordingly, there are diverse methods of selecting the input modes of the remote controller 200.

According to an exemplary embodiment of the present invention, respective input menus corresponding to a control mode, a character input mode and a handwriting mode of an image processing apparatus are integrated into a single remote controller in lieu of the plurality of related art input units, thereby occupying a relatively small installation space and removing the inconvenience of changing the input units according to the modes.

Further, various functions are integrated into a single remote controller, thereby reducing costs.

Also, a touch screen is employed, thereby allowing a user to easily select and execute various input menus and making a user's input easy.

Moreover, it is possible to transmit diverse input information to an image processing apparatus capable of supporting bidirectional communication, thereby enhancing utility of the image processing apparatus.

Although a few exemplary embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. An apparatus comprising:
    a touch screen;
    a communicator; and
    a processor configured to control the touch screen to display a user interface (UI),
    wherein in response to receiving a first signal via the communicator while a first UI is displayed, the processor is configured to control the touch screen to display a second UI, and
    wherein the processor is configured to transmit a second signal corresponding to a user input through the second UI to a TV via the communicator so that the TV processes the second signal and transmits the processed second signal to a server through a network.

2. The apparatus according to claim 1, wherein the first UI corresponds to a first input mode for controlling the TV and the second UI corresponds to a second input mode for inputting characters.

3. The apparatus according to claim 1, wherein the second signal corresponding to the user input comprises character information.

4. The apparatus according to claim 1, wherein the processor is configured to divide the touch screen into a plurality of areas and to simultaneously display the first UI and the second UI on the plurality of areas, respectively.

5. The apparatus according to claim 1, wherein in response to receiving the first signal for selecting at least two UIs of the plurality of the UIs, the processor is configured to display the at least two selected UIs in accordance with the first signal.

6. The apparatus according to claim 1, wherein the first signal is transmitted from the TV.

7. A system comprising:
   a TV; and
   an input apparatus configured to remotely control the TV by a user,
   the input apparatus comprising:
      a touch screen;
      a communicator; and
      a processor configured to control the touch screen to display a UI,
   wherein in response to receiving a first signal via the communicator while a first UI is displayed, the processor is configured to control the touch screen to display a second UI, and
   wherein the processor is configured to transmit a second signal corresponding to a user input through the second UI to the TV via the communicator so that the TV processes the second signal and transmits the processed second signal to a server through a network.

8. The system according to claim 7, wherein the first UI corresponds to a first input mode for controlling the TV and the second UI corresponds to a second input mode for inputting characters.

9. The system according to claim 7, wherein the second signal corresponding to the user input comprises character information.

10. The system according to claim 7, wherein the processor is configured to divide the touch screen into a plurality of areas and to simultaneously display the first UI and the second UI on the plurality of areas, respectively.

11. The system according to claim 7, wherein in response to receiving the first signal for selecting at least two UIs of the plurality of the UIs, the processor is configured to display the at least two selected UIs in accordance with the first signal.

12. The system according to claim 7, wherein the first signal is transmitted from the TV.

13. A non-transitory computer-readable medium recording instructions for execution by a processor of an apparatus to cause the apparatus to perform operations comprising:
   displaying a first UI on a touch screen of the apparatus;
   receiving a first signal from a TV while the first UI is displayed;
   displaying a second UI on the touch screen in response to the apparatus receiving the first signal; and
   transmitting a second signal corresponding to a user input through the second UI to the TV so that the TV processes the second signal and transmits the processed second signal to a server through a network.

14. The non-transitory computer-readable medium according to claim 13, wherein the first UI corresponds to a first input mode for controlling the TV and the second UI corresponds to a second input mode for inputting characters.

15. The non-transitory computer-readable medium according to claim 13, wherein the second signal corresponding to the user input comprises character information.

16. The non-transitory computer-readable medium according to claim 13, wherein the displaying the second UI comprises
   dividing the touch screen into a plurality of areas; and
   simultaneously displaying the first UI and the second UI on the plurality of areas, respectively.

17. The non-transitory computer-readable medium according to claim 13, wherein the displaying the second UI further comprises
   in response to receiving the first signal for selecting at least two UIs, displaying the at least two selected UIs in accordance with the first signal.

18. The non-transitory computer-readable medium according to claim 13, wherein the first signal is transmitted from the TV.

* * * * *

UNITED STATES PATENT AND TRADEMARK OFFICE
CERTIFICATE OF CORRECTION

| | | |
|---|---|---|
| PATENT NO. | : 10,003,845 B2 | Page 1 of 1 |
| APPLICATION NO. | : 15/097713 | |
| DATED | : June 19, 2018 | |
| INVENTOR(S) | : Ki-moon Kwon | |

It is certified that error appears in the above-identified patent and that said Letters Patent is hereby corrected as shown below:

On the Title Page

Item [30],
Delete "Dec. 5, 2007 (KR) 10-2007-0125449"
Insert --Dec. 5, 2007 (KR) 10-2007-0125499--

Signed and Sealed this
Thirty-first Day of August, 2021

Drew Hirshfeld
*Performing the Functions and Duties of the*
*Under Secretary of Commerce for Intellectual Property and*
*Director of the United States Patent and Trademark Office*